United States Patent
Pueschner et al.

(10) Patent No.: US 9,633,303 B2
(45) Date of Patent: Apr. 25, 2017

(54) SMART CARD MODULE ARRANGEMENT

(71) Applicant: Infineon Technologies AG, Neubiberg (DE)

(72) Inventors: Frank Pueschner, Kelheim (DE); Juergen Hoegerl, Regensburg (DE); Peter Scherl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/215,229

(22) Filed: Mar. 17, 2014

(65) Prior Publication Data
US 2014/0263663 A1    Sep. 18, 2014

(30) Foreign Application Priority Data

Mar. 18, 2013 (DE) .......................... 10 2013 102 718

(51) Int. Cl.
*G06K 19/06* (2006.01)
*G06K 19/077* (2006.01)

(52) U.S. Cl.
CPC . *G06K 19/07756* (2013.01); *G06K 19/07745* (2013.01); *G06K 19/07749* (2013.01); *H01L 2224/16225* (2013.01); *H01L 2224/32225* (2013.01); *H01L 2224/73204* (2013.01); *H01L 2924/181* (2013.01); *Y10T 29/49018* (2015.01)

(58) Field of Classification Search
USPC ........................................................ 235/492
See application file for complete search history.

(56) References Cited

U.S. PATENT DOCUMENTS

| | | | |
|---|---|---|---|
| 6,378,774 B1* | 4/2002 | Emori et al. | .................. 235/492 |
| 2002/0053735 A1 | 5/2002 | Neuhaus et al. | |
| 2002/0056855 A1 | 5/2002 | Reiner | |
| 2009/0145971 A1* | 6/2009 | Yin | ................... G06K 19/0716 235/492 |

FOREIGN PATENT DOCUMENTS

| | | |
|---|---|---|
| CN | 1278936 A | 1/2001 |
| CN | 102222262 A | 10/2011 |
| CN | 102521645 A | 6/2012 |
| DE | 19645067 A1 | 5/1998 |
| WO | 0067198 A1 | 11/2000 |
| WO | 2012149680 A1 | 11/2012 |

OTHER PUBLICATIONS

Chinese Office Action based on application No. 201410099175.2 (7 pages) dated Feb. 20, 2017 (for reference purpose only).

* cited by examiner

*Primary Examiner* — Jamara Franklin
(74) *Attorney, Agent, or Firm* — Viering, Jentschura & Partner mbB

(57) ABSTRACT

In various embodiments, a smart card module arrangement is provided. The smart card module arrangement includes a carrier, in which a depression is formed, a smart card module, which is arranged in the depression, and a smart card antenna. The smart card antenna can be coupled to the smart card module in a contactless manner.

23 Claims, 6 Drawing Sheets

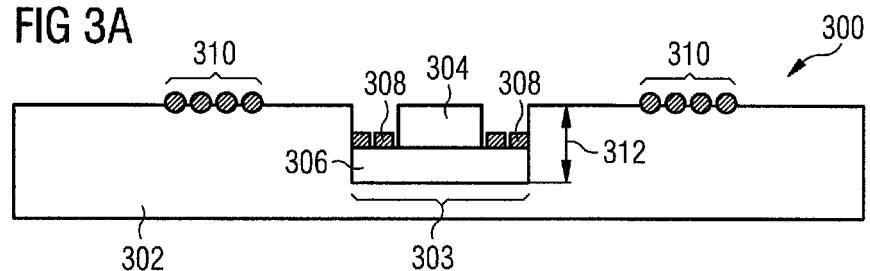
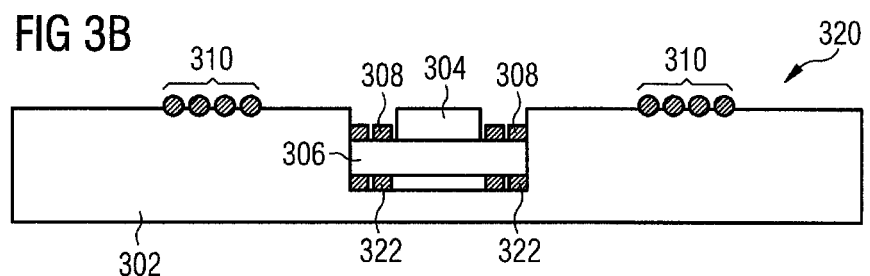
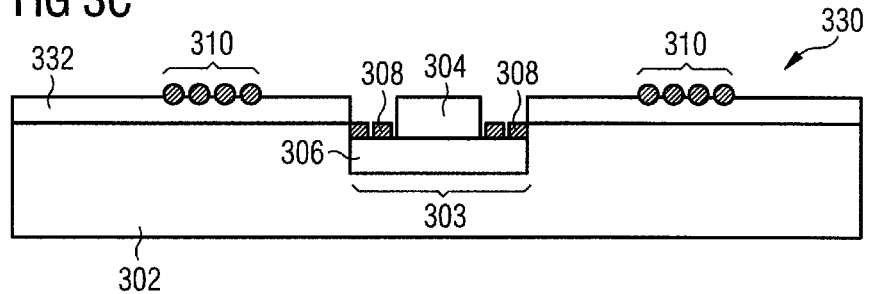
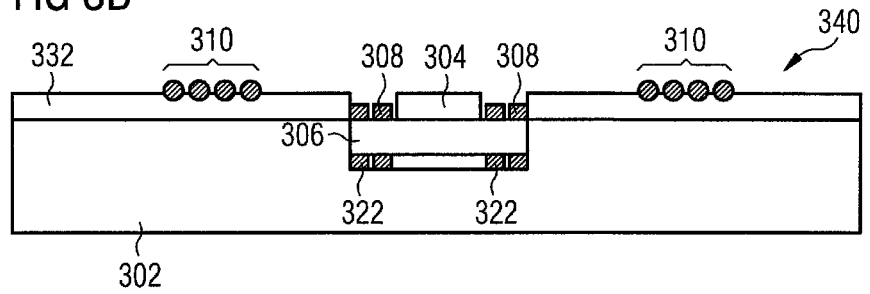

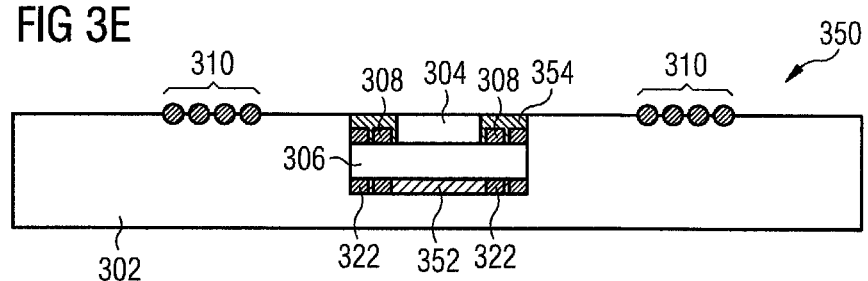
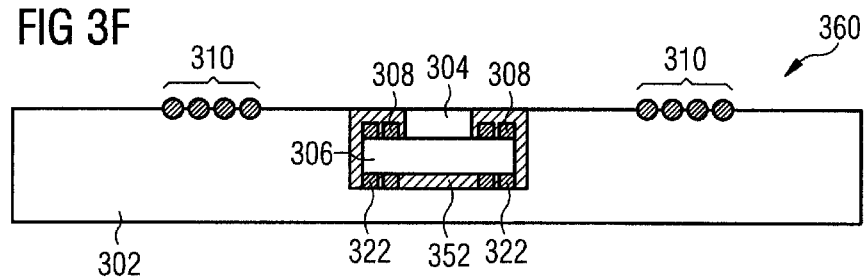
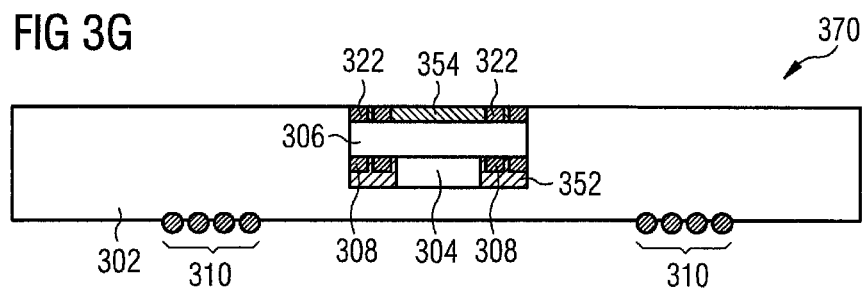

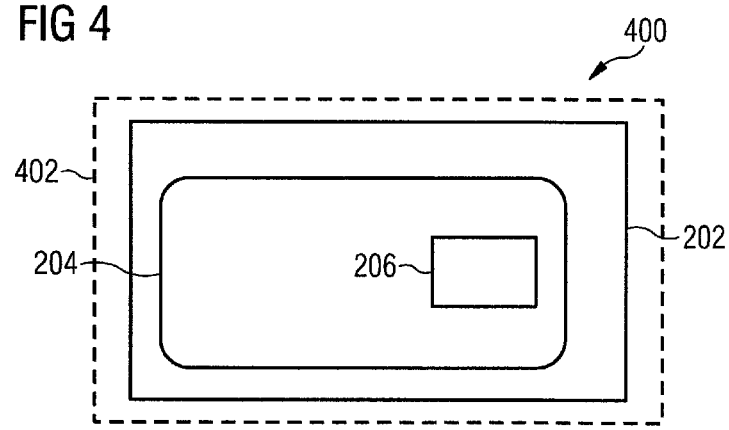

SMART CARD MODULE ARRANGEMENT

CROSS-REFERENCE TO RELATED APPLICATION

This application claims priority to German Patent Application Serial No. 10 2013 102 718.0, which was filed Mar. 18, 2013, and is incorporated herein by reference in its entirety.

TECHNICAL FIELD

Various embodiments relate generally to a smart card module arrangement.

BACKGROUND

Nowadays, most smart cards are those which communicate with a reader in a contact-based manner. That is to say that a contact zone is arranged on the smart card, said contact zone constituting an interface to corresponding contacts in the reader. In addition, however, smart cards can also be designed for contactless (wireless) communication. For this purpose, a smart card antenna can be provided in the smart card, such that the communication can be effected wirelessly therewith and by means of the magnetic field generated by the reader.

Both the smart card antenna and the smart card module, which accommodates the electronics of the smart card, can be arranged within the smart card. The smart card antenna is then electrically coupled to the smart card module usually via corresponding contacts.

One weak point in the production of the smart cards described is the contact point between the smart card antenna and the smart card module, that is to say the linking of the smart card antenna wire to the smart card module. In one conventional contact-making method, so-called thermocompression welding, the antenna wire is welded to the smart card module by means of pressure and temperature. In this case, the smart card module is subjected to high thermal and also mechanical loads. Problems, for example in the form of failures for the user, can then arise for example as a result of the delamination of the potting compound body (which covers the surface of the smart card module and protects the chip) from the smart card module or as a result of inadequate adhesion of the antenna wire to the smart card module.

SUMMARY

In various embodiments, a smart card module arrangement is provided. The smart card module arrangement includes a carrier, in which a depression is formed, a smart card module, which is arranged in the depression, and a smart card antenna. The smart card antenna can be coupled to the smart card module in a contactless manner.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A to 3G show various embodiments of the smart card module arrangement, illustrated in each case in a cross-sectional view;

FIG. 4 shows a schematic construction of one embodiment of a smart card including the smart card module arrangement in accordance with various embodiments;

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc., is used with reference to the orientation of the figure(s) described. Since components of embodiments can be positioned in a number of different orientations, the direction terminology serves for illustration purposes and is not restrictive in any way at all. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and also a direct or indirect coupling. In the figures, identical or similar elements are provided with identical reference signs, insofar as this is expedient.

Figure 1:
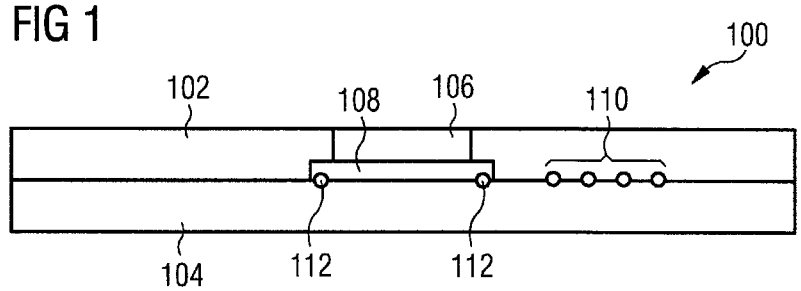
FIG. 1 shows a customary arrangement including a smart card module and associated carrier layers in a cross-sectional view.

FIG. 1 illustrates a conventional arrangement 100 including a smart card module and associated carrier layers in a cross-sectional view. The arrangement 100 includes an upper carrier layer 102 (substrate layer) and a lower carrier layer 104. The smart card module, which includes a chip 106 and a smart card module carrier 108, is embedded in the upper substrate layer 102. A smart card antenna 110 is arranged between the upper substrate layer 102 and the lower substrate layer 104. In this example, the smart card antenna 110 has four conductor tracks in cross section. The smart card antenna 110 is directly electrically connected to the smart card module carrier 108 by means of contact points 112, on which carrier a wiring layer may be provided, such that ultimately the chip 106 is connected to the smart card antenna 110. It should be noted that the smart card antenna 110 illustrated in the arrangement 100 cannot be regarded as a booster antenna since it constitutes the sole antenna of the arrangement 100 and does not function as an amplifier antenna. The arrangement 100 may be part of a customary smart card, for example.

When the associated smart card is carried for example in a trouser pocket or purse/wallet, it can be subjected to severe mechanical loads, for example bending. As a result, for example, the contact points 110 can detach from the smart card module carrier 108, such that the smart card becomes unusable.

Figure 2:
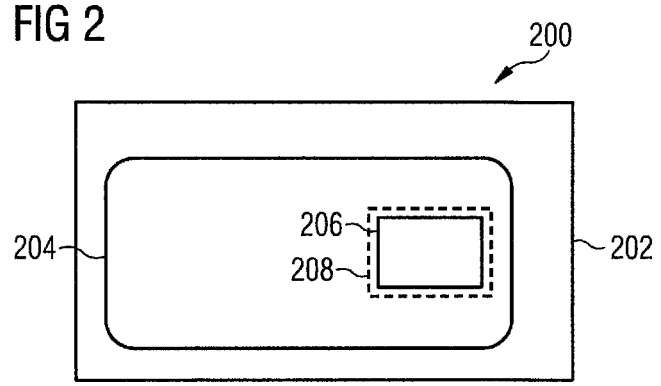
FIG. 2 shows a schematic construction of the smart card module arrangement in accordance with various embodiments.

A small card module arrangement in accordance with various embodiments is illustrated in a structural plan view in FIG. 2. The smart card module arrangement 200 in accordance with various embodiments includes a carrier 202, in which a depression 208 is formed. Furthermore, the smart card module arrangement 200 in accordance with various embodiments includes a smart card module 206, which is arranged in the depression 208, and a smart card antenna 204, wherein the smart card antenna 204 is coupled, or it can be coupled, to the smart card module 206 in a contactless manner.

The smart card module arrangement 200 in accordance with various embodiments may include a base surface, which defines the base surface of an associated smart card. The depression 208 may correspond to the base surface of the smart card module 206 or be made somewhat larger. To put it another way, the smart card module 206 may be inserted into the depression 208 with an appropriate fit. It can additionally be fixed on the bottom of the depression 208, for example by means of an adhesive, if the depression 208 is made larger, or it can be potted with a potting compound in the depression and thereby likewise be fixed in the depression. In this case, the geometrical shape of the depression 208 can substantially correspond to the geometrical shape of the smart card module 206 and may be formed for example in square, rectangular or round fashion or have some other suitable shape. The depression 208 may be arranged within a region which is enclosed by conductor tracks of the smart card module antenna 204. In the plan view of the smart card module arrangement 200, by way of example, the smart card module 206 may be arranged in a manner bearing by one of its edges against only one edge of the smart card module antenna 204 or which can be arranged in a manner bearing by two of its edges against a corner of the smart card module antenna 204. However, it is also possible to provide a specific coupling region in which the smart card module 206 is arranged. The specific coupling region may be completely surrounded by conductor track turns of the smart card antenna 204 and may be present for example in the form of a coupling-out of the conductor track turns of the smart card antenna 204 from their normal course. It should be noted that the smart card antenna 204 of the smart card module arrangement 200 in accordance with various embodiments is a booster antenna which may couple inductively to a smart card module antenna provided on the smart card module 206 (not illustrated in FIG. 2), in order thus to improve the strength and/or range of the wireless communication. A smart card module antenna arranged on the smart card module 206 may be regarded as a wireless replacement of the otherwise direct electrical coupling between the smart card module 206 and the smart card antenna 204.

The carrier 202 may have, for example, a thickness in a range of approximately 25 μm to approximately 50 μm The carrier 202 may include or consist of, for example, polyvinyl chloride (PVC), polyester, polycarbonate, polyimide (PI) or FR4 (glass fiber matt impregnated with epoxy resin). The base surface of the carrier 202 may substantially correspond to the smart card in which the smart card module arrangement 200 in accordance with various embodiments can be embedded. A free space in the depression 208 that is not occupied by the smart card module 206 can be sealed/filled with a filling material, for example with PSA (pressure sensitive adhesive; adhesive layer on a carrier, which adhesive layer starts to adhere under mechanical loading), liquid polycarbonate, plastic such as e.g. epoxy resin or thermoplastic materials.

Various embodiments of the smart card module arrangement are illustrated below in cross-sectional views in FIG. 3A to FIG. 3G. The embodiments chosen constitute only a segment from the total range of possible embodiments. The different features of the individual embodiments can be combined with one another in order to provide further embodiments which are subject to the basic concept of the smart card module arrangement in accordance with various embodiments. Owing to the fundamental similarity among the various embodiments, identical components are provided with identical reference signs and are not described anew in each embodiment.

FIG. 3A illustrates one embodiment of the smart card module arrangement. The smart card module arrangement 300 includes a carrier 302, in which a depression 303 is formed. The depression 303 (cavity) may be a blind hole, for example, the depth 312 of which can be, for example, in a range of approximately 100 μm to approximately 300 μm, for example may have a depth 312 of approximately 200 μm. The bottom surface of the depression 303 can correspond to the base surface of the smart card module, for example, such that the smart card module is pressed into the depression 303, such that there is no gap between the edges of the smart card module and the walls of the depression. In this case, the smart card module should be understood substantially as the arrangement of the chip 304 on the smart card module carrier 306 together with further components arranged on the smart card module carrier 306. Furthermore, the smart card module antenna is formed on the smart card module 306, which antenna may include conductor track turns 308 arranged, for example, in a region around the chip 304 on a surface of the smart card module carrier 306. The depth of the depression (indicated by the arrow 312) may correspond to the device height of the smart card module, which can substantially be determined by the thickness of the smart card module carrier 306 and the thickness of the chip 304. As is furthermore illustrated in FIG. 3A, the smart card module antenna 310 is arranged on a surface, in this case the upper surface of the carrier 302. In this embodiment of the smart card module arrangement 300, the smart card module antenna 310 includes four conductor track turns running in a ring-shaped fashion around the depression 303 in which the smart card module is arranged. The conductor track turns—shown in cross section—of the smart card module antenna 310 may be displaced in relation to the position thereof illustrated in FIG. 2 laterally on the upper surface of the carrier 302, such that the depression 303 does not have to lie in the central region of a surface enclosed by the conductor track turns of the smart card antenna 310. Moreover, the distance between the innermost conductor track turn of the smart card antenna 310 and the projection of the depression 303 onto the upper surface of the carrier toward the right-hand side and toward the left-hand side may be embodied differently. In this embodiment, the smart card module antenna 308 and the smart card antenna 310 are formed on the same side of the carrier 302.

In a modification, not illustrated, of the embodiment illustrated in FIG. 3A, the smart card antenna 310 may be arranged on the lower surface (bottom) of the carrier 302.

FIG. 3B illustrates a further embodiment of the smart card module arrangement. The smart card module arrangement 320 differs from the smart card module arrangement 300 illustrated in FIG. 3A in accordance with various embodiments in that the smart card module antenna 308, which is formed on an upper surface of the smart card module carrier 306, the chip 304 also being arranged on said upper surface, may additionally also have, on the lower surface (bottom surface) of the smart card module carrier 306, further conductor track turns 322 (together with a wiring (not illustrated in the figure) which electrically couples the chip 304 to both smart card module antenna parts). Consequently, the smart card module antenna in the embodiment of the smart card module arrangement 320 as shown in FIG. 3B may include upper conductor track turns 308 (arranged on the same side of the smart card module carrier 306 as the chip 304) and lower conductor track turns 322 (arranged on the opposite side of the smart card module carrier 306 relative to the chip 304). Such an embodiment may be appropriate, for example, if there is not enough space on the upper surface of the smart card carrier 306 to provide a sufficiently large smart card module antenna, or if generally the base surface of the smart card module is intended to be made smaller. In this embodiment, too, the smart card antenna 310 may be arranged on the upper surface of the carrier 302 or at the lower surface of the carrier 302.

In a further embodiment, not illustrated, of the smart card module arrangement, the smart card module antenna may include conductor track turns which are arranged only at the lower surface of the smart card module carrier 306, that is to say—referring to FIG. 3B—may have only lower conductor track turns 322.

FIG. 3C illustrates a further embodiment of the smart card module arrangement. The smart card module arrangement 330 is similar to the smart card module arrangement 300 shown in FIG. 3A, but here the smart card antenna 310 is formed on a smart card antenna carrier 332. The smart card antenna carrier 332 is arranged on the upper surface of the carrier 302. Alternatively, however, the smart card antenna carrier 332 together with the smart card antenna 310 can be arranged on the lower surface of the carrier 302. In the embodiment of the smart card module arrangement 330 as illustrated in FIG. 3C, the depression 303 is formed such that the smart card module does not project from the depression beyond the upper surface of the small card antenna carrier 332. To put it another way, the device height of the smart card module corresponds to the sum of the thickness of the smart card antenna carrier 332 and the depth 312 of the depression 303.

FIG. 3D illustrates a further embodiment of the smart card module arrangement in accordance with various embodiments. The embodiment of the smart card module arrangement 340 as shown in FIG. 3D may be regarded as a combination of the embodiments of the smart card module arrangement shown in FIG. 3B and in FIG. 3C, that is to say the combination of the smart card antenna carrier 322 with a smart card module in which the smart card module antenna 308 also includes lower conductor track turns 322 at the bottom surface of the smart card module carrier 306. That part of the smart card module antenna 308 which is formed on the upper surface of the smart card module carrier 306 may be electrically coupled to the conductor track turns 322 at the lower surface of the smart card module carrier 306 by means of feedthroughs (not illustrated in FIG. 3D) formed into the smart card module carrier 306.

FIG. 3E illustrates a further embodiment of the smart card module arrangement in accordance with various embodiments.

The embodiment of the smart card module arrangement 350 as shown in FIG. 3E substantially corresponds to the smart card module arrangement 320 shown in FIG. 3B in accordance with various embodiments. In addition, however, in the case of the smart card module arrangement 350 in FIG. 3E, the bottom surface of the smart card module carrier 306 is connected to the bottom of the depression 303 by means of an adhesive 352. The adhesive may be for example an adhesive such as epoxy resin. Generally, in every other embodiment of the smart card module arrangement as well, an adhesive can be arranged between the bottom surface of the smart card module carrier 306 and the bottom of the depression, in order additionally to connect the smart card module 306 to the carrier 302 or to fix it to the latter. FIG. 3E additionally illustrates that that volume of the depression 303 which is not physically occupied by the smart card module is filled with a filling material 352 (potting material) which can be, for example, epoxy resin or some other plastic. With the potting material 352, firstly, the smart card module can be potted in the depression 303 and an inherently encapsulated unit can thus be produced. Secondly, with the potting material 352, the free space in the depression 303 can be filled such that a continuously planar surface of the carrier 302 can be reestablished. It should be noted that the position and/or the function of the adhesive 342 and of the filling material 354 can be interchanged. That is to say that the adhesive 352 can fill the free space between the smart card module carrier 306 and the upper edge of the depression 303, which is defined by the rest of the upper surface of the carrier 302, and the potting material 354 can fill the free space (or the free spaces) between the bottom of the depression 303 and the lower surface of the smart card module carrier 306. Alternatively, it is also possible to use only the adhesive 352 or the potting material 354 for the free spaces.

FIG. 3F illustrates a further embodiment of the smart card module arrangement. In the case of this smart card module arrangement 360, the base surface of the depression 303 is larger than the base surface of the smart card module, and so the smart card module need not be press-fitted into the depression. To put it another way, at least one side (edge) of the smart card module arrangement is not in contact with a sidewall of the depression 303. In the embodiment illustrated, on both sides of the smart card module there is in each case a gap toward the sidewalls of the depression 303. In this embodiment, the volume not occupied by the smart card module is filled with an adhesive 352 and/or a filling material in the form of a plastic. Analogously to the embodiment in FIG. 3E, here as well a continuously planar upper surface of the carrier 302 is present as a result of the filling of the depression 303. It should be noted that this embodiment can be realized equally well with a smart card module in which the smart card module antenna 308 is formed only on the upper surface of the smart card module carrier 306 and no further turns 322 are formed at the lower surface of the smart card module carrier 306.

FIG. 3G illustrates a further embodiment of the smart card module arrangement 370. In the case of the embodiments of the smart card module arrangement shown up to now, the chip 304 was always arranged on that surface of the smart card module carrier 306 which faces toward the opening of the depression 303. In the embodiment of the smart card module arrangement 370 as illustrated in FIG. 3G, the smart card module carrier 306 can be arranged upside down in the depression 303, or the chip 304 can be fitted alternatively (instead of on the upper surface of the smart card module carrier 306) at the lower surface of the smart card module carrier 306. That is to say that the chip 304 is arranged between the bottom of the depression 303 and the smart card module carrier 306. The smart card module antenna includes both upper conductor track turns and lower conductor track turns. The free space between the bottom of the depression 303 and that surface of the smart card module 306 which faces said bottom is filled with the adhesive 352. The volume above the smart card module carrier 306 is filled with the potting material 354 in such a way that a planar upper surface of the carrier 302 is provided. In this embodiment of the smart card module arrangement 370, the smart card antenna 310 is formed at the lower surface of the carrier 302 and, consequently, the chip 304 faces toward the lower surface of the carrier 302 relative to the smart card module carrier 306. Analogously to the embodiment of the smart card module arrangement 350 as shown in FIG. 3, the position/role of the adhesive 352 and of the potting material 354 can be interchanged. Alternatively, it is also possible to use only the adhesive 352 or the potting material 354 for the free spaces.

FIG. 4 illustrates a schematic construction of an exemplary smart card 400 including the smart card module arrangement in accordance with various embodiments. The smart card module arrangement corresponds to the smart card module arrangement illustrated in FIG. 2 and can be sealed for example toward the outside with one or a plurality of covering layers/laminating layers 402. To put it another way, the smart card module arrangement in accordance with various embodiments may correspond to one or a plurality of layers in a smart card layer stack, wherein the respective bottommost and topmost layer of the entire smart card stack can be a covering layer/laminating layer 402, which constitute the surfaces with which a potential user of the smart card comes into contact. In the illustration in FIG. 4, merely for the sake of clarity, the covering layer(s) 402 is (are) shown larger than the carrier 202 of the smart card module arrangement in accordance with various embodiments. Usually, the base surface of the carrier 202 can correspond to the base surface(s) of the laminating layer(s) 402.

Figure 5A:
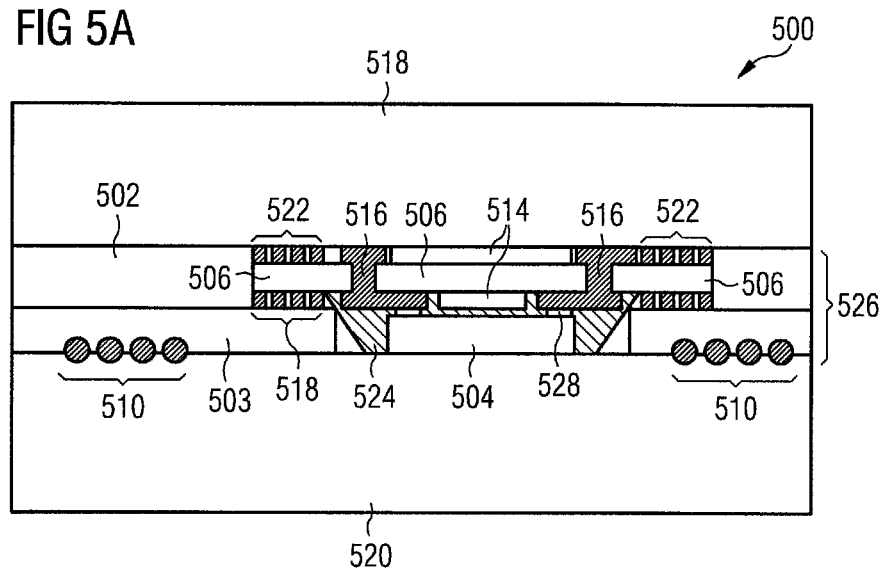
FIGS. 5A and 5B show a construction of a smart card in accordance with various embodiments in a cross-sectional view.

A construction of one embodiment of a smart card 500 is illustrated in a cross-sectional view in FIG. 5A. The smart card 500 can be regarded as a smart card layer stack. The two outermost layers 518, 520 may be covering layers/laminating layers which determine the haptic nature and visual appearance of the smart card 500 and are additionally intended to protect the core layers in the interior of the smart card 500. In the case of the exemplary smart card 500 illustrated in FIG. 5A, the smart card module arrangement 526 is arranged between the first covering layer 518 and the second covering layer 520, such that in this simplified embodiment the smart card 500 includes as it were three functional layers (plies). The smart card module arrangement 526 in accordance with various embodiments can, however, be regarded in a representative manner as an arbitrary smart card material layer sequence expediently adapted to the functional scope of the smart card, such that the smart card 500 in accordance with various embodiments may include more layers than those described here. Nowadays modern smart cards may include an arrangement of approximately ten, twelve or more layers one above another. The proportions of the parts/components illustrated in FIG. 5A with respect to one another do not necessarily correspond to actual dimensions of parts/components and the proportions thereof with respect to one another in actually manufactured smart cards. Rather, the illustration in FIG. 5A serves to elucidate the construction of the smart card 500 in accordance with various embodiments.

In the case of the exemplary smart card 500 illustrated in FIG. 5A, the first covering layer 518 may be an upper covering layer, and the second covering layer 520 can be a lower covering layer. The carrier may be arranged therebetween, said carrier in this embodiment including a first carrier material ply 502 and a second carrier material ply 503. The bottom surface of the depression/opening in the first carrier material ply 503 is formed in such a way that it corresponds to the base surface of the carrier 506 of the smart card module. The second carrier material ply 503, which is formed at the first carrier material ply 502, has a depression/opening having a smaller extent than the depression formed in the first carrier material ply 502. The depressions/openings in the two carrier material plies 502, 503 jointly form a hollow space (a cavity) in which the smart card module is arranged. In this case, the sidewall is formed in a stepped fashion as a result of the different base surfaces of the two openings. The smart card module in accordance with various embodiments can substantially include the components illustrated in FIG. 3A to FIG. 3G and correspond to one of the smart card modules illustrated there. The chip 504 may be arranged on a surface of the smart card module carrier 506, for example the lower surface. A wiring structure 514 may be arranged at the upper surface and at the lower surface of the smart card module carrier 506, said wiring structure providing an electrical connection between the smart card module antenna 508, 522 and the chip 504. In this case, the chip 504 may be in electrical contact with the wiring structure 514 by means of metal solder bumps, and the region between the surface of the smart card module carrier 506 and the underside of the chip 504 can optionally be filled with an underfill. The part of the wiring structure 514 on the upper surface of the smart card module carrier 506 and the part of the wiring structure 514 on the lower surface of the smart card module carrier 506 can be electrically connected to one another by means of electrically conductive feedthroughs 516 running through the electrically non-conductive smart card module carrier 506. In this embodiment of the smart card module arrangement 526 in accordance with various embodiments, the smart card module antenna 508, 522 is arranged in an outer region of the smart card module and includes upper conductor track turns 522 and lower conductor track turns 508. The smart card module antenna 508, 522 is electrically connected to the chip 504 by means of the wiring layer 514. The first carrier material layer 502 and the second carrier material layer 503 have the task of forming a cavity for the chip packet, that is to say substantially for the smart card module carrier 506 together with—arranged thereon—chip 504 and conductor tracks and/or further elements. The chip 504 illustrated in FIG. 5A and the first carrier material layer 502 form a step that is compensated for by the second material layer 503. Furthermore, a so-called underfill (an elastic, thermally stable plastic) is arranged under and/or around the chip 504 and mechanically connects the chip 504 to the carrier 506. As a result of shrinkage of the underfill during the production process, the bumps 528 can additionally be pressed onto corresponding contact areas.

In the embodiment shown in FIG. 5A, the smart card antenna 510 of the smart card 500 is arranged between the second carrier material ply 503 and the second covering layer 520. The conductor track turns of the smart card antenna 510 run—as viewed from the chip 504 radially toward the side edges of the smart card 500 (which are formed by the side edges of the first covering layer 518, the first carrier material ply 502, the second carrier material ply 503 and the second covering layer 520)—in an outer region of the smart card 500 in a ring-shaped fashion substantially around the smart card module. On account of the inductive coupling between the smart card module antenna 508, 522 and the smart card antenna 510 (which functions as a booster antenna), which makes direct electrical connections between the smart card antenna 510 and the smart card module dispensable, the smart card antenna 510 can be arranged at a different location depending on available space within the smart card 500. By way of example, the smart card antenna 510 can be arranged on a smart card antenna carrier layer and/or be separated by further smart card material layers from the smart card module arrangement 526 in accordance with various embodiments. In principle, the smart card antenna 510 can be arranged between two arbitrary smart card material layers within the smart card 500. To put it another way, the smart card antenna 510 in the illustration in FIG. 5A may be arranged in a manner offset further downward or further upward within the smart card 500. It is not necessary for the smart card antenna 510 to be formed directly at a surface of the smart card module arrangement 526. The smart card 500 in accordance with various embodiments thus enables configurations in which the smart card antenna 510 is situated in a position lying further from the smart card module arrangement 526 in accordance with various embodiments. This can be the case, for example, for a security-relevant smart card material layer formed directly at the smart card module arrangement 526. Such a security-relevant smart card material layer may include for example a hologram and/or a circuit which provides a security-relevant functionality and should be directly electrically connected to the smart card module in the smart card module arrangement 526.

The first covering layer 518 and the second covering layer 520 can each have a thickness in a range of approximately 200 µm to approximately 400 µm, for example can have a thickness of approximately 300 µm. The smart card module arrangement 526 in accordance with various embodiments can have a thickness in a range of approximately 100 µm to approximately 300 µm, for example in a range of approximately 150 µm to approximately 250 µm, for example a thickness of approximately 200 µm. Accordingly, the total thickness of the smart card illustrated in FIG. 5A can be, for example, approximately 500 µm to approximately 800 µm. However, these are only exemplary dimensions which can vary depending on the material used for the respective smart card material layers and depending on the number of individual smart card material layers.

Figure 5B:
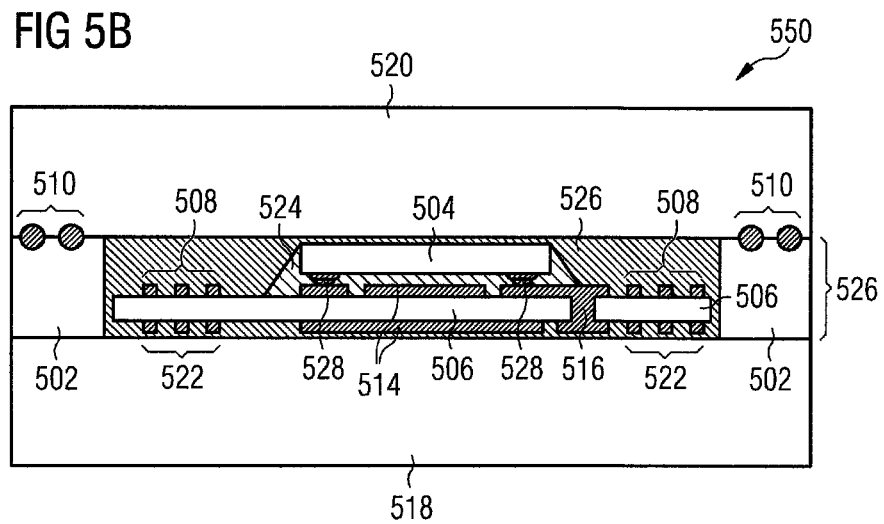

FIG. 5B illustrates a further embodiment of a smart card 550 in a cross-sectional view. The construction of the exemplary smart card 550 in FIG. 5B is based on the construction of the smart card 500 in FIG. 5A. Accordingly, the same elements bear the same reference signs and will not be described again.

In contrast to the smart card 500 illustrated in FIG. 5A, in these embodiments the carrier 502 (or else carrier layer 502) of the smart card module arrangement 526 of the smart card 550 illustrated in FIG. 5B is embodied as a single ply. The smart card module arrangement 526 is already brought to a rectangular shape by a compensation layer, such that the first material layer 502 and the second material layer 503 from FIG. 5A are combined to form a carrier 502. The base surface of the depression in the carrier 502 corresponds to the base surface of the smart card module, which is determined by the base surface of the smart card module carrier 506. That volume not occupied by the smart card module in the depression formed in the carrier 502 of the smart card module arrangement 526 in accordance with various embodiments can be filled with a filling material 526, for example an adhesive such as PSA or epoxy resin.

As a result of the filling of the depression with a filling material, which has already been described with regard to the embodiments of the smart card module arrangement as illustrated in FIG. 3A to FIG. 3G, it is possible to avoid height differences between the surface of the region in the carrier 502 at the position of the depression and that surface of the carrier 502 which surrounds the depression. Such height differences can be perceived as visual unevennesses on one of the surfaces of the smart card and found to be disturbing. As a result of the filling of the depression (blind hole) with the filling material 526, precisely these visual unevennesses can be avoided as a result of the formation of a continuously planar surface of the smart card module carrier 502.

Figure 6:
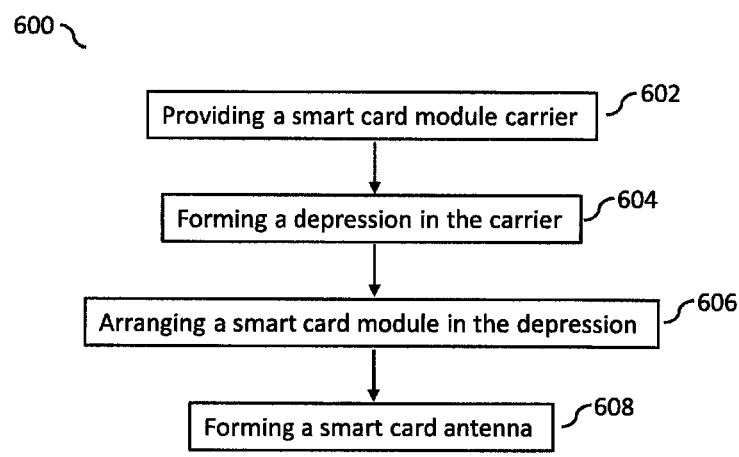
FIG. 6 shows a flow chart illustrating one exemplary method for producing the smart card module arrangement in accordance with various embodiments.

FIG. 6 illustrates a flow chart 600 illustrating one exemplary method for producing the smart card module arrangement in accordance with various embodiments. The method can begin by the carrier 202 being provided in 602. Afterward, in 604 a depression 208 can be formed in the carrier 202, and in 606 a smart card module 206 can be arranged in the depression 208. Finally, in 608 the smart card antenna 204 can be formed, which can be coupled to the smart card module 206 in a contactless manner.

Figure 7:
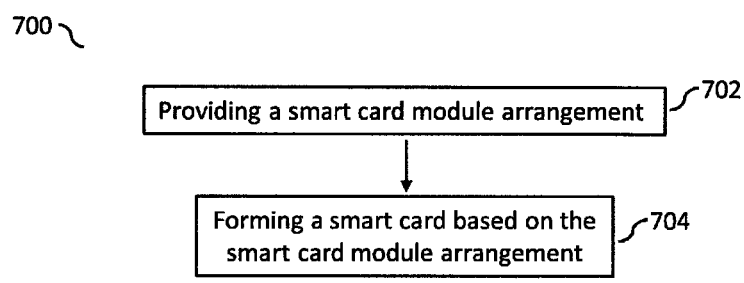
FIG. 7 shows a flow chart illustrating one exemplary method for producing the smart card in accordance with various embodiments.

FIG. 7 illustrates a flow chart 700 illustrating one exemplary method for producing the smart card in accordance with various embodiments. The method can include in 702 providing the smart card module arrangement in accordance with various embodiments. In 704 the method can include forming a smart card on the basis of the smart card module arrangement in accordance with various embodiments. Forming the smart card can include, for example, arranging at least one smart card layer on and/or below the smart card module arrangement in accordance with various embodiments, which for example functions as a covering layer and seals the smart card module arrangement in order to protect the latter against external influences during the use of the smart card.

In various embodiments, a smart card module arrangement is provided, including a carrier, in which a depression is formed, a smart card module, which is arranged in the depression, and a smart card antenna, wherein the smart card antenna is coupled to the smart card module in a contactless manner.

The smart card module may be a constituent of smart cards, for example of smart cards in accordance with a smart card standard such as, for example, the smart card standard ISO/IEC 7810 and ISO/IEC 7816.

The carrier of the smart card module arrangement in accordance with various embodiments can be a core carrier of a smart card, said carrier carrying the smart card module. A smart card module embodied in the carrier of the smart card module arrangement may include a chip, that is to say an integrated circuit, which may contain logic and memory circuits (or blocks), and thus determines the functional scope of the smart card. In this case, the wiring structure constitutes the electrical connection infrastructure for the components/devices situated on the smart card module (such as coils or capacitors, for instance). In general, a smart card can communicate with readers in a contact-based manner or in a contactless manner or, alternatively, may be designed as a dual interface smart card, that is to say include means both for contact-based and for contactless communication. A smart card module of a customary contact-based smart card is normally coupled to a contact zone, which is exposed at the surface of the smart card and with which contact may be made by contacts of a reader. A smart card module of a contactless smart card can include a smart card module antenna, for example a coil in the form of conductor track turns. The joint arrangement of the coil and of the chip on a smart card module is also designated as CoM (coil on module). In order to enable wireless communication over relatively great distances, which is difficult to realize owing to the relatively small size of the smart card module antenna, a smart card antenna may be provided in the smart card, and the smart card module antenna may couple inductively to said smart card antenna.

The smart card antenna is usually a large-format antenna in the form of conductor track turns, which antenna may be present in a manner embedded in the smart card and, in principle, may extend within said smart card over the entire region of the smart card. The smart card antenna then provides the external wireless (i.e. contactless) communication interface to a reader. With the use of the smart card antenna in interaction with a smart card module antenna arranged on the smart card module, the smart card antenna is also designated as a booster antenna (amplifier antenna). A dual interface smart card can then be understood as a combination of a contact-based and a contactless smart card and correspondingly has both communication interfaces.

As a result of the inductive coupling of the smart card module antenna to the smart card antenna, the smart card module arrangement in accordance with various embodiments does not exhibit the above-explained problem of the susceptible contact point between the smart card antenna and the smart card module. To put it another way, the smart card antenna need no longer be directly electrically coupled to the smart card module, which could otherwise be effected by welding, for example. As a result, the smart card module antenna in accordance with various embodiments, which antenna may be provided/laminated in a smart card, can better withstand mechanical stresses. As a result of the omission of this formation—otherwise required in the production method—of the contact-making, a process step can be saved and the method for producing the smart card module arrangement in accordance with various embodiments may be made more cost-effective. Moreover, the smart card module can be protected since it is not subjected to the above-described loads that occur during the customary contact-making process. By virtue of the fact that it is not necessary to form conductor tracks between the smart card module and the smart card antenna, the smart card module in the depression of the carrier can be covered/potted with a potting material. A robust, inherently encapsulated smart card module can be produced in this way. In addition, the position of the booster antenna is then independent of the position of the carrier accommodating the smart card module, to the effect that further material layers can be formed between these two.

In the case of the smart card module arrangement in accordance with various embodiments, the smart card module antenna can be formed, for example, on an upper surface or on a lower surface of the carrier. In the case of such an embodiment, an additional carrier ply for the smart card antenna can thus be obviated. Alternatively, however, the smart card antenna can be formed on a smart card antenna carrier layer or some other smart card material layer and can also be separated from the carrier by further smart card material layers. In other words, the position of the carrier and the position of the smart card antenna relative to one another in a customary smart card stack that forms a smart card can be arbitrary since a direct electrical connection between the smart card antenna and the smart card module is not necessary on account of the inductive coupling. In other words, in such a case, there is no need to form complex and costly feedthroughs through the other material layers which separate the booster antenna from the carrier. In this way, it is possible to obtain a degree of freedom with regard to the position of the smart card antenna relative to the position of the smart card module, such that further smart card material layers can be provided between these two without any problems.

In various embodiments, a smart card module arrangement is provided, which can include a carrier, in which a depression can be formed; a smart card module, which can be arranged in the depression, and a smart card antenna, wherein the smart card antenna can be coupled to the smart card module in a contactless manner.

In accordance with further embodiments of the smart card module arrangement, the carrier can include a non-conductive carrier material.

In accordance with further embodiments of the smart card module arrangement, the smart card module can include a smart card module carrier and a chip, which is arranged on an upper surface of the smart card module carrier and includes an integrated circuit.

In accordance with further embodiments of the smart card module arrangement, the smart card module can furthermore include a coil, which is coupled to the integrated circuit.

In accordance with further embodiments of the smart card module arrangement, turns of the coil can be arranged on the upper surface of the smart card module carrier.

In accordance with further embodiments of the smart card module arrangement, turns of the coil can be arranged at a lower surface of the smart card module carrier, which is situated opposite the upper surface.

In accordance with further embodiments of the smart card module arrangement, turns of the coil can be formed both on the upper surface and at the lower surface of the smart card module carrier.

In accordance with further embodiments of the smart card module arrangement, the smart card module may be arranged (in other words located) in the depression in such a way that an upper surface of the smart card module faces the bottom of the depression.

In accordance with further embodiments of the smart card module arrangement, the smart card module may be arranged (in other words located) in the depression in such a way that a lower surface of the smart card module faces a bottom of the depression.

In accordance with further embodiments of the smart card module arrangement, the depression may be filled with a material in such a way that the carrier has a planar upper surface.

In accordance with further embodiments of the smart card module arrangement, the smart card module may be fixed to the bottom of the carrier by means of an adhesive.

In accordance with further embodiments of the smart card module arrangement, the bottom surface of the depression may correspond to the base surface of the smart card module.

In accordance with further embodiments of the smart card module arrangement, the bottom surface of the depression may be larger than the base surface of the smart card module.

In accordance with further embodiments of the smart card module arrangement, the smart card antenna may have turns formed at a surface of the smart card module arrangement.

In accordance with further embodiments of the smart card module arrangement, the turns of the smart card antenna may be arranged on the surface of the smart card module arrangement toward which the depression is open.

In accordance with further embodiments of the smart card module arrangement, the turns of the smart card antenna can be arranged at the surface of the smart card module arrangement which is situated opposite the opening of the depression.

In accordance with further embodiments, the smart card module arrangement can furthermore include a smart card antenna carrier, wherein turns of the smart card antenna are formed at a surface of the smart card antenna carrier.

In accordance with further embodiments of the smart card module arrangement, the smart card antenna carrier can be formed at the carrier.

In accordance with further embodiments of the smart card module arrangement, a base surface of the smart card antenna carrier and a base surface of the carrier can be identical.

In accordance with further embodiments of the smart card module arrangement, at least one material layer can be arranged between the smart card antenna carrier and the carrier.

In accordance with further embodiments of the smart card module arrangement, turns of the smart card antenna can run, as viewed from the center of the smart card module arrangement in a radial direction toward the edges of the smart card module arrangement, outside the region of the smart card module.

In various embodiments, a smart card is provided, including the smart card module arrangement.

In accordance with further embodiments, the smart card can include a contact arrangement, which is provided at a surface of the smart card and is electrically coupled to the smart card module.

In accordance with further embodiments, the smart card can be designed to communicate with a reader by means of the contact arrangement.

In accordance with further embodiments, the smart card can be designed to communicate with a reader in a contactless manner by means of the smart card antenna.

In accordance with further embodiments, the smart card can be designed as a dual interface smart card.

In various embodiments, a method for producing a smart card module arrangement is provided, wherein the method may include: providing a carrier; forming a depression in the carrier; arranging a smart card module in the depression; and forming a smart card antenna, which is coupled to the smart card module in a contactless manner.

In accordance with further embodiments of the method, the smart card module may be arranged in the depression in such a way that an upper surface of the smart card module faces a bottom of the depression.

In accordance with further embodiments of the method, the smart card module may be arranged in the depression in such a way that a lower surface of the smart card module faces the bottom of the depression.

In accordance with further embodiments, the method may furthermore include filling the depression with a material in such a way that the carrier has a planar upper surface.

In accordance with further embodiments, the method may include depositing an adhesive between the smart card module and the bottom of the depression.

In accordance with further embodiments of the method, turns of the smart card antenna may be formed at a surface of the smart card module arrangement.

In accordance with further embodiments, the method may furthermore include providing a smart card antenna carrier and arranging turns of the smart card antenna at a surface of the smart card antenna carrier.

In accordance with further embodiments, the method may furthermore include arranging the smart card antenna carrier onto the smart card module arrangement.

In accordance with further embodiments, the method may furthermore include forming at least one material layer between the smart card antenna carrier and the carrier.

In accordance with further embodiments of the method, the at least one material layer can have the same base surface as the carrier and/or the smart card antenna carrier.

In various embodiments, a method for producing a smart card is furthermore provided, wherein the method may include: providing a smart card module arrangement in accordance with various embodiments, and arranging at least one smart card layer on and/or below the smart card module arrangement.

In accordance with further embodiments of the method, the at least one smart card layer can include a cover layer of the smart card.

In accordance with further embodiments of the method, the at least one smart card layer may include a layer which includes a circuit.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. A smart card module arrangement, comprising:
a carrier, in which a depression is formed;
a smart card module arranged in the depression; and
a smart card antenna, wherein the smart card antenna is coupled to the smart card module in a contactless manner; wherein the smart card antenna comprises turns disposed on an exterior surface of the carrier.

2. The smart card module arrangement of claim 1,
wherein the smart card module comprises:
   a smart card module carrier; and
   a chip, which is arranged on an upper surface of the smart card module carrier and comprises an integrated circuit.

3. The smart card module arrangement of claim 1, wherein the smart card module furthermore comprises a coil, which is coupled to the integrated circuit.

4. The smart card module arrangement of claim 3, wherein turns of the coil are formed at least one of on the upper surface or at the lower surface of the smart card module carrier.

5. The smart card module arrangement of claim 1, wherein the depression is filled with a material in such a way that the carrier has a planar upper surface.

6. The smart card module arrangement of claim 1, wherein the turns of the smart card antenna are arranged on the surface of the smart card module arrangement toward which the depression is open.

7. The smart card module arrangement of claim 1, wherein the turns of the smart card antenna are arranged at the surface of the smart card module arrangement which is situated opposite the opening of the depression.

8. The smart card module arrangement of claim 1, further comprising:
   a smart card antenna carrier, wherein turns of the smart card antenna are formed at a surface of the smart card antenna carrier.

9. The smart card module arrangement of claim 8, wherein the smart card antenna carrier is formed at the carrier.

10. The smart card module arrangement of claim 8, wherein at least one material layer is arranged between the smart card antenna carrier and the carrier.

11. The smart card module arrangement of claim 1, wherein turns of the smart card antenna run, as viewed from the center of the smart card module arrangement in a radial direction toward the edges of the smart card module arrangement, outside the region of the smart card module.

12. A smart card, comprising:
a smart card module arrangement, comprising:
   a carrier, in which a depression is formed;
   a smart card module arranged in the depression; and
   a smart card antenna, wherein the smart card antenna is coupled to the smart card module in a contactless manner; wherein the smart card antenna comprises turns disposed on an exterior surface of the carrier.

13. The smart card of claim 12, further comprising:
a contact arrangement, which is provided at a surface of the smart card and is electrically coupled to the smart card module.

14. The smart card of claim 13, wherein the smart card is designed to communicate with a reader by means of the contact arrangement.

15. The smart card of claim 12, wherein the smart card is designed to communicate with a reader in a contactless manner by means of the smart card antenna.

16. The smart card of claim 12, wherein the smart card is designed as a dual interface smart card.

17. A method for producing a smart card module arrangement, the method comprising:
   providing a carrier;
   forming a depression in the carrier;
   arranging a smart card module in the depression; wherein the depression has a depth substantially equivalent to the height of the smart card module; and
   forming a smart card antenna, which is coupled to the smart card module in a contactless manner; wherein the smart card antenna comprises turns disposed on an exterior surface of the carrier.

18. The method of claim 17, wherein the smart card module is arranged in the depression in such a way that an upper surface of the smart card module faces a bottom of the depression.

19. The method of claim 17, wherein the smart card module is arranged in the depression in such a way that a lower surface of the smart card module faces the bottom of the depression.

20. The method of claim 17, further comprising:
filling the depression with a material in such a way that the carrier has a planar upper surface.

21. The method of claim 17, further comprising:
forming a smart card antenna carrier; and
arranging turns of the smart card antenna at a surface of the smart card antenna carrier.

22. The method of claim 21, further comprising:
forming at least one material layer between the smart card antenna carrier and the carrier.

23. A method for producing a smart card, the method comprising:
   providing a smart card module arrangement, comprising
      a carrier, in which a depression is formed;
      a smart card module arranged in the depression; wherein the depression has a depth substantially equivalent to the height of the smart card module; and
      a smart card antenna, wherein the smart card antenna is coupled to the smart card module in a contactless manner; wherein the smart card antenna comprises turns disposed on an exterior surface of the carrier;
   arranging at least one smart card layer at least one of on or below the smart card module arrangement.

* * * * *